United States Patent
Du et al.

(10) Patent No.: US 11,637,254 B2
(45) Date of Patent: Apr. 25, 2023

(54) DISPLAY PANEL, MANUFACTURING METHOD THEREOF, AND ELECTRONIC DEVICE

(71) Applicant: SHENZHEN CHINA STAR OPTOELECTRONICS SEMICONDUCTOR DISPLAY TECHNOLOGY CO., LTD., Guangdong (CN)

(72) Inventors: Yanying Du, Guangdong (CN); Jinchuan Li, Guangdong (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 440 days.

(21) Appl. No.: 16/624,210

(22) PCT Filed: Nov. 20, 2019

(86) PCT No.: PCT/CN2019/119621
§ 371 (c)(1),
(2) Date: Dec. 18, 2019

(87) PCT Pub. No.: WO2021/092983
PCT Pub. Date: May 20, 2021

(65) Prior Publication Data
US 2021/0408420 A1    Dec. 30, 2021

(30) Foreign Application Priority Data
Nov. 14, 2019  (CN) .......................... 201911110093.2

(51) Int. Cl.
  *H01L 51/50*  (2006.01)
  *H01L 27/32*  (2006.01)
(Continued)

(52) U.S. Cl.
  CPC ...... *H01L 51/5004* (2013.01); *H01L 27/3244* (2013.01); *H01L 51/001* (2013.01);
(Continued)

(58) Field of Classification Search
CPC combination set(s) only.
See application file for complete search history.

(56) References Cited

U.S. PATENT DOCUMENTS

| 6,541,130 B2 | 4/2003 | Fukuda |
| 2003/0044639 A1 | 3/2003 | Fukuda et al. |

(Continued)

FOREIGN PATENT DOCUMENTS

| CN | 102820433 A | 12/2012 |
| CN | 102891265 A | 1/2013 |

(Continued)

*Primary Examiner* — Moin M Rahman
(74) *Attorney, Agent, or Firm* — Geoffrey Lottenberg; Berger Singerman LLP

(57) ABSTRACT

A display panel, a manufacturing method thereof, and an electronic device are provided. The panel includes a thickness of a first setting film layer of each of the colored organic light-emitting units of each color is an odd multiple of a half wavelength of the light of the corresponding color, and/or a thickness of a second setting film layer of each of the colored organic light-emitting units is an even multiple of the half wavelength of the light of the corresponding color, wherein the second setting film layer is close to a light-emitting side of the display panel, and the first setting film layer is disposed below the second setting film layer.

15 Claims, 3 Drawing Sheets

(51) Int. Cl.
*H01L 51/00* (2006.01)
*H01L 51/56* (2006.01)
(52) U.S. Cl.
CPC .......... *H01L 51/0097* (2013.01); *H01L 51/56* (2013.01); *H01L 2251/5338* (2013.01); *H01L 2251/558* (2013.01)

(56) References Cited

U.S. PATENT DOCUMENTS

| | | |
|---|---|---|
| 2014/0319483 A1 | 10/2014 | Moon et al. |
| 2015/0228932 A1* | 8/2015 | Ma .................... H01L 51/5016 257/40 |
| 2017/0170206 A1* | 6/2017 | Lee .................... H01L 51/52 |
| 2018/0090715 A1 | 3/2018 | Yasukawa |
| 2018/0145138 A1 | 5/2018 | Lee et al. |
| 2019/0036081 A1* | 1/2019 | Osawa .................... H01L 51/50 |
| 2019/0334102 A1 | 10/2019 | Fan |
| 2019/0393278 A1* | 12/2019 | Wu .................... H01L 27/323 |

FOREIGN PATENT DOCUMENTS

| | | |
|---|---|---|
| CN | 104022144 A | 9/2014 |
| CN | 107195797 A | 9/2017 |
| CN | 108598122 A | 9/2018 |
| CN | 109037283 A | 12/2018 |
| CN | 110335955 A | 10/2019 |
| KR | 20110060373 A | 6/2011 |

* cited by examiner

DISPLAY PANEL, MANUFACTURING METHOD THEREOF, AND ELECTRONIC DEVICE

CROSS-REFERENCE TO RELATED APPLICATIONS

This application is National phase under 35 U.S.C. § 371 of International Application No. PCT/CN2019/119621, filed Nov. 20, 2019, which claims the benefit of and priority to Chinese Patent Application No. 201911110093.2, filed Nov. 14, 2019. The entire contents of these patent applications are hereby incorporated by reference herein.

FIELD OF INVENTION

The present invention relates to the field of display technologies, and in particular, to a display panel, a manufacturing method thereof, and an electronic device.

BACKGROUND OF INVENTION

Since the flexible display panels have a bendable characteristic, they are widely used, such as screens with bending regions at edges.

In practical applications, the viewing angles of the user is at a certain angle with a vertical direction of the screen in general. For the bending regions at edges (bending region), the human eye has a relatively less effective area, so the light flux into the human eye is less. With an increase of the bending angles, the brightness of the display screen gradually becomes darker. The brightness of the bending region and a non-bending region are different, that is, a clear transition area from light to dark is observed in the bending region, and even a color of an edge of the bending region is close to a color of the frame, which results in poor brightness uniformity of the display panel and reduces the display effect.

Therefore, it is necessary to provide a display panel, a manufacturing method thereof, and an electronic device to solve the problems existing in the conventional art.

SUMMARY OF INVENTION

An object of the present invention is to provide a display panel, a manufacturing method thereof, and an electronic device, which can improve the uniformity of the brightness of a display screen, thereby improving the display effect.

In order to solve the above technical problem, the present invention provides a display panel, the display panel includes at least one bending region and a non-bending region in a top view, wherein a cross-sectional structure of the display panel includes:

a display unit provided on a flexible substrate, wherein the display unit includes a plurality of colored organic light-emitting units, each of the colored organic light-emitting units of each color is configured to emit light of a corresponding color, and a cross-sectional structure of each of the colored organic light-emitting units includes: an anode, an organic light-emitting layer, a cathode, and an encapsulation layer;

wherein a thickness of a first setting film layer of each of the colored organic light-emitting units of each color is an odd multiple of a half wavelength of the light of the corresponding color, and/or a thickness of a second setting film layer of each of the colored organic light-emitting units is an even multiple of the half wavelength of the light of the corresponding color, wherein the second setting film layer is close to a light-emitting side of the display panel, and the first setting film layer is disposed below the second setting film layer.

The present invention also provides a method of manufacturing a display panel, wherein the display panel includes a bending region and a non-bending region, and the method includes:

fabricating an anode on a flexible substrate;
fabricating an organic light-emitting layer on the anode;
fabricating a cathode and an encapsulation layer on the organic light-emitting layer in sequence;

wherein a thickness of a first setting film layer of each of the colored organic light-emitting units of each color is an odd multiple of a half wavelength of the light of the corresponding color, and/or a thickness of a second setting film layer of each of the colored organic light-emitting units is an even multiple of the half wavelength of the light of the corresponding color, wherein the second setting film layer is close to a light-emitting side of the display panel, and the first setting film layer is disposed below the second setting film layer.

The present invention also provides an electronic device including the above display panel.

The display panel of the present invention, the manufacturing method thereof, and the electronic device using same, wherein a thickness of a first setting film layer of each of the colored organic light-emitting units of each color is an odd multiple of a half wavelength of the light of the corresponding color, and/or a thickness of a second setting film layer of each of the colored organic light-emitting units is an even multiple of the half wavelength of the light of the corresponding color, and the thickness of the first setting film layer is an odd multiple of the half wavelength of the light of the corresponding color, so that the light emitted to the anode exhibits an effect of increasing reflection; the thickness of the second setting film layer is an even multiple of the half wavelength of the light of the corresponding color, so that the light emitted to the light-emitting side exhibits an effect of increasing transmittance. As a result, the light output rate of the bending region is increased, and the brightness of the bending region and the non-bending region is more uniform, which improves the display effect.

DETAILED DESCRIPTION OF EMBODIMENTS

Figure 1:
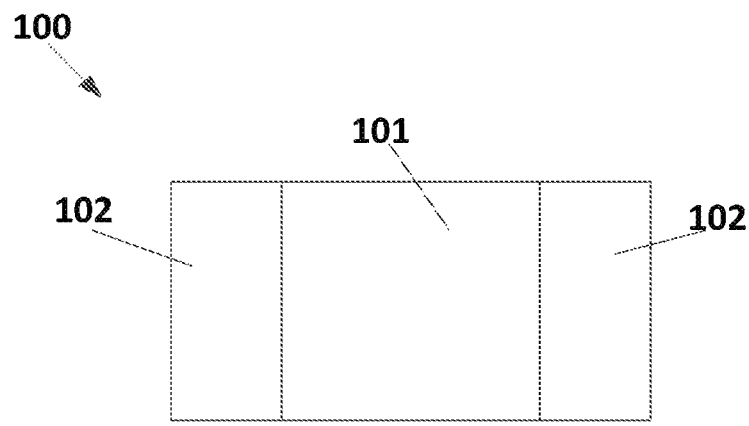
FIG. 1 is a top view of a display panel in a flat state according to the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

The terms "first", "second", and the like in the description and claims of the present application and the above-mentioned drawings are configured to distinguish different objects, rather than describing a specific order. Furthermore, the terms "including" and "having", as well as any modification of them, are intended to cover non-exclusive inclusions.

Figure 2:
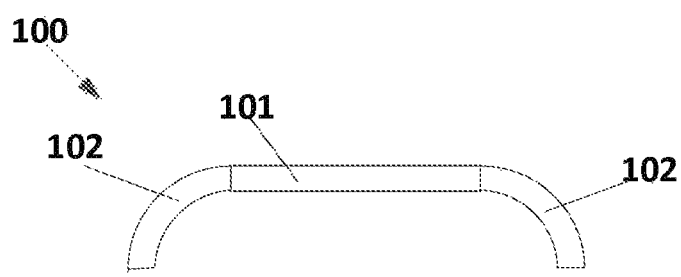
FIG. 2 is a side view of the display panel in a folded state according to the present invention.

As shown in FIGS. 1 and 2, a display panel 100 of the present embodiment can be in a flat state and a folded state in a plan view, which includes a non-bending region 101 and a bending region 102 on both sides of the non-bending region. It can be understood that the number of bending region can be one or two or more.

Figure 3:
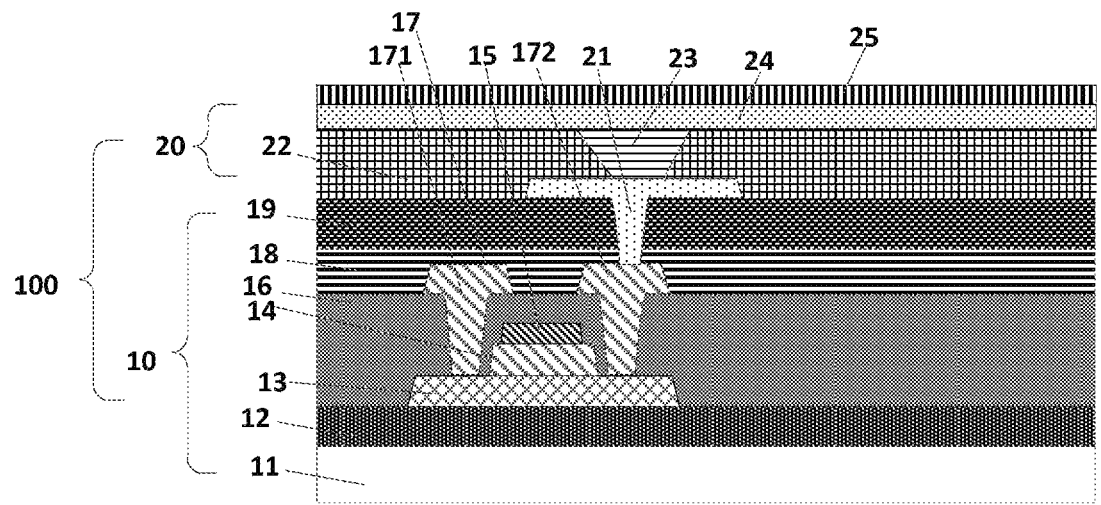
FIG. 3 is a schematic structural view of the display panel according to the present invention.

As shown in FIG. 3, a cross-sectional structure of the display panel 100 in the present embodiment includes a flexible substrate 10 and a display unit 20.

The flexible substrate 10 can include a base substrate 11, and an active layer 13, a gate 15, a source 171, and a drain 172 disposed on the base substrate 11. In one embodiment, the base substrate 11 is further provided with a buffer layer 12. The buffer layer 12 is disposed between the base substrate 11 and the active layer 13, and a gate insulating layer 14 is disposed between the active layer 13 and the gate 15. In addition, it can further include a first insulating layer 16 disposed below a second metal layer 17, and a passivation layer 18 and a planarization layer 19 sequentially disposed on the second metal layer 17. The planarization layer 19 is disposed with a via hole.

The display unit 20 is disposed on the flexible substrate 10. The display unit 20 includes a plurality of colored organic light-emitting units, and each of the colored organic light-emitting units of each color is configured to emit light of a corresponding color. For example, the colored organic light-emitting units can include a red organic light-emitting unit, a green organic light-emitting unit, and a blue organic light-emitting unit. The red organic light-emitting unit is configured to emit red light, the green organic light-emitting unit is configured to emit green light, and the blue organic light-emitting unit is configured to emit blue light. A cross-sectional structure of the organic light-emitting unit of each color includes an anode 21, an organic light-emitting layer 23, a cathode 24, and an encapsulation layer 25.

The anode 21 is connected to the drain 172 through the via hole. The organic light-emitting layer 23 is disposed on the anode 21. The organic light-emitting layer 23 can include a red organic light-emitting layer, a green organic light-emitting layer, and a blue organic light-emitting layer. The anode 21 can be provided with a pixel definition layer 22, and the pixel definition layer 22 is provided with an opening region. The organic light-emitting layer 23 is positioned in the opening region, and a position of the opening region corresponds to a position of the anode 21. The cathode 24 is disposed on the organic light-emitting layer 23, the encapsulation layer 25 is disposed on the cathode 24. In one embodiment, the encapsulation layer 25 can be a stacked structure of an inorganic layer and an organic layer. In one embodiment, a first functional layer can be disposed between the anode 21 and the organic light-emitting layer 23, and the first functional layer can be a hole injection layer. A second functional layer can be disposed between the organic light-emitting layer 23 and the cathode 24, and the second functional layer can be an electron transport layer. It can be understood that when the above display panel is an active-matrix organic light-emitting diode (AMOLED) display panel, the display panel can further include a spacer material layer, wherein the spacer material layer is provided on the pixel definition layer 22.

A thickness of a first setting film layer of each of the colored organic light-emitting units of each color is an odd multiple of a half wavelength of light of the corresponding color, and/or a thickness of a second setting film layer of each of the colored organic light-emitting units is an even multiple of the half wavelength of the light of the corresponding color, wherein the second setting film layer is close to a light-emitting side of the display panel, and the first setting film layer is disposed below the second setting film layer. Each of the second setting film layer and the first setting film layer can include at least one film layer.

The thickness of the first setting film layer is an odd multiple of the half wavelength of the light of the corresponding color, so that the light emitted to the anode exhibits an effect of increasing reflection; the thickness of the second setting film layer is an even multiple of the half wavelength of the light of the corresponding color, so that the light emitted to the light-emitting side exhibits an effect of increasing transmittance. As a result, the light output rate of the bending region is increased, and the brightness of the bending region and the non-bending region is more uniform, which improves the display effect.

In one embodiment, the thickness of the first setting film layer of each of the colored organic light-emitting units of each color in the non-bending region 101 is an odd multiple of a half wavelength of the light of the corresponding color, a compensation film thickness of the first setting film layer of each of the colored organic light-emitting units of each color in the bending region 102 is an odd multiple of the half wavelength of the light of the corresponding color, and the compensation film thickness of the first setting film layer is obtained by compensating the thickness of the first setting film layer through a preset included angle, wherein the preset included angle is an included angle between a tangent direction of the bending region and a setting line.

In one embodiment, the thickness of the second setting film layer of each of the colored organic light-emitting units of each color in the non-bending region 101 is an even multiple of a half wavelength of the light of the corresponding color, a compensation film thickness of the second setting film layer of each of the colored organic light-emitting units of each color in the bending region 102 is an even multiple of the half wavelength of the light of the corresponding color, and the compensation film thickness of the second setting film layer is obtained by compensating the thickness of the second setting film layer through a preset included angle, wherein the preset included angle is an included angle between a tangent direction of the bending region and a setting line.

In one embodiment, the first setting film layer includes the anode, and the second setting film layer includes the cathode and the encapsulation layer. A thickness of the anode 21 of each of the colored organic light-emitting units positioned in the non-bending region 101 is an odd multiple of the half wavelength of the light of the corresponding color. A compensation film thickness of the anode 21 of each of the colored light-emitting units of each color in the bending region is an odd multiple of the half wavelength of the light of the corresponding color. Taking the red organic light-emitting unit as an example, the thickness of the anode 21 of the red organic light-emitting unit in the non-bending region 101 is an odd multiple of a half wavelength of the red light, and the thickness of the anode 21 of the red organic light-emitting unit in the bending region 102 is an odd multiple of a half wavelength of the red light. A compensation film thickness of the anode 21 is obtained by compensating the thickness of the anode through a preset included angle.

And/or a thickness of the cathode 24 and a thickness of the encapsulation layer 25 of each of the colored organic light-emitting units of each color positioned in the non-bending region 101 are even multiple of the half wavelength of the light of the corresponding color. A compensation film thickness of the cathode 24 and a compensation film thickness of the encapsulation layer 25 of each of the colored organic light-emitting units of each color positioned in the bending region 102 are even multiple of the half wavelength of the light of the corresponding color. The thickness of the cathode 24 and the thickness of the encapsulation layer 25 in the red organic light-emitting unit positioned in the non-bending region 101 are both an even multiple of a half wavelength of red light. The compensation film thickness of the cathode 24 and the compensation film thickness of the encapsulation layer 25 in the red organic light-emitting unit positioned in the bending region 102 are even multiple of the half wavelength of the red light. It can be understood that the organic light-emitting units of other colors are similar to this. The compensation film thickness of the cathode 24 and the compensation film thickness of the encapsulation layer 25 are respectively obtained by compensating the thickness of the corresponding film layer through a preset included angle.

Meanwhile, in one embodiment, the first setting film layer further includes the first functional layer, and a thickness of the first functional layer of each of the colored organic light-emitting units of each color in the non-bending region 101 can also be an odd multiple of a half wavelength of the light of the corresponding color. A compensation film thickness of the first functional layer of each of the colored organic light-emitting units positioned in the bending region 102 can also be an odd multiple of the half wavelength of the light of the corresponding color.

Meanwhile, the compensation film thickness d1 of the first setting film layer or the compensation film thickness d1 of the second setting film layer is calculated by the following formula:

$$d1 = d0/\cos \varphi;$$

where d0 is the thickness of the first setting film layer or the thickness of the second setting film layer, and $\varphi$ is a preset included angle. It can be understood that the setting line can be a line of sight of a user in front view of the display panel, such as a line direction perpendicular to the display panel, namely a right sight line.

Figure 4:
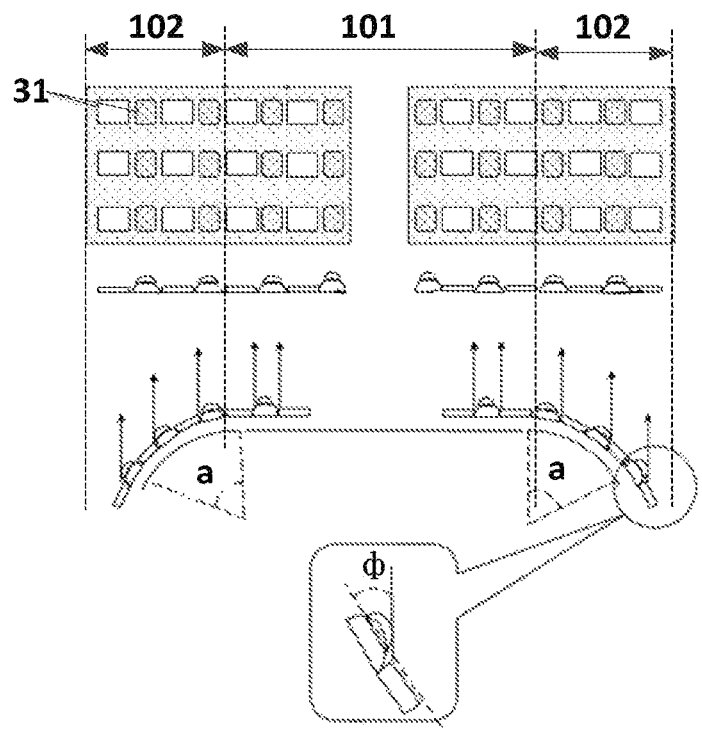
FIG. 4 is a comparison view of the display panel in the flat state and the display panel in the folded state according to the present invention.

As shown in FIG. 4, a bending angle of the bending region 102 in FIG. 4 is a, and the compensation film thickness of the anode 21 of the organic light-emitting unit 31 of each color positioned in the bending region 102 is an odd multiple of a half wavelength of the light of the corresponding color.

And/or the compensation film thickness of the cathode 24 and the compensation film thickness of the encapsulation layer 25 of the organic light-emitting unit 31 of each color positioned in the bending region 102 are even multiple of the half wavelength of the light of the corresponding color.

The compensation film thickness is obtained by compensating the thickness of the corresponding film layer through a preset included angle $\varphi$, and the preset included angle $\varphi$ is an included angle between a tangent direction of the bending region and a setting line.

For example, the right sight line is a line direction perpendicular to the display panel, such as a line perpendicular to a paper surface (as shown by an arrow direction in FIG. 4). For example, if an outermost region is 45° relative to a vertical line, the compensation film thickness d1 of the anode 21 of the organic light-emitting unit 31 of each color in the bending region 102 is an odd multiple of the half wavelength of the light of the corresponding color, that is $$d1 = d0/\cos 45°.$$

In one embodiment, the second setting film layer further includes the organic light-emitting layer. Of course, in order to further improve light output rate and uniformity of the brightness, a thickness of the organic light-emitting layer 23 of each of the colored organic light-emitting units of each color positioned in the non-bending region 101 is an even multiple of the half wavelength of the light of the corresponding color. A compensation film thickness of the organic light-emitting layer 23 of each of the colored organic light-emitting units of each color in the bending region 102 is an even multiple of the half wavelength of the light of the corresponding color.

In one embodiment, the second setting film layer further includes the second functional layer. A thickness of the second functional layer in the non-bending region 101 can also be an even multiple of a half wavelength of light of a corresponding color. A compensation film thickness of the second functional layer positioned in the bending region 102 can also be an even multiple of the half wavelength of the light of the corresponding color.

Figure 5:
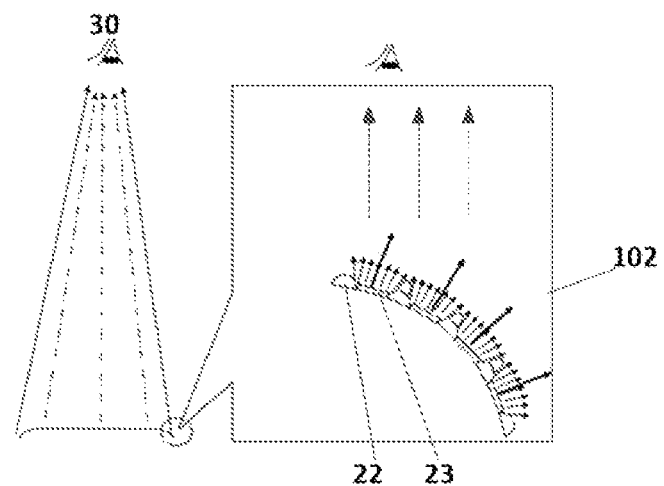
FIG. 5 is a schematic user viewing diagram of a bending region of the display panel according to the present invention.

Due to the flexible bent display panel, as shown in FIG. 5, especially the flexible bent display panel which is fixedly bent, a light transmission direction (shown by solid line with arrow) at edges (bending region) and a viewing direction the human eye 30 of an actual user (shown by dotted line with arrow) are inconsistent, resulting in poor light output efficiency in the viewing direction of the human eye. Therefore, by setting the compensation film thickness of the above-mentioned film layer in the bending region to be an odd or even multiple of the half wavelength of the light of the corresponding color, the light output rate of the bending region can be further increased.

In order to further improve the display effect, the thicknesses of the organic light-emitting layers of the organic light-emitting units of the same color in the bending region 102 are equal.

Of course, the thicknesses of the organic light-emitting layers of the organic light-emitting units of the same color in the non-bending region 101 can also be equal.

Since each film thickness of each layer from a bottom of the organic light-emitting layer to the anode is an odd multiple of the half wavelength of the corresponding color light, so that the light emitted to the anode exhibits an effect of increasing reflection, that is, increased reflected light. Since each film thickness of each layer between the organic light-emitting layer and the encapsulation layer is an even multiple of the half wavelength of the corresponding color light, so that the light emitted to the light-emitting side exhibits an effect of increasing transmittance. As a result, the light output rate of the bending region is increased, and the brightness of the bending region and the non-bending region is more uniform, which improves the display effect.

It can be understood that, in an embodiment, the film thickness of each layer from the bottom of the organic light-emitting layer to the anode is different, and the film thickness of each layer between the organic light-emitting layer and the encapsulation layer is different, that is, each film layer is a different multiple of the half wavelength of the light of the corresponding color. For example, each of the colored organic light-emitting units of each color, the compensation film thickness of the cathode is twice and the compensation film thickness of the encapsulation layer is 4 times the half wavelength of the light of the corresponding color, and the compensation film thickness of the organic light-emitting layer is 6 times the half wavelength of the light of the corresponding color. Understandably, the remaining film layers are similar.

The invention also provides a method of manufacturing a display panel, which includes the following.

S101, fabricating an anode on a flexible substrate.

For example, referring to FIG. 3, the anode 21 is fabricated on the flexible substrate 10. The flexible substrate 10 can include a pixel definition layer 22, and an opening region is disposed on the pixel definition layer 22.

S102, fabricating an organic light-emitting layer on the anode.

For example, an organic luminescent material is vapor-deposited in the opening region to obtain an organic light-emitting layer 23.

S103, fabricating a cathode and an encapsulation layer on the organic light-emitting layer in sequence.

The cathode 24 and the encapsulation layer 25 are sequentially formed on the organic light-emitting layer 23.

Meanwhile, wherein a thickness of a first setting film layer of each of the colored organic light-emitting units of each color is an odd multiple of a half wavelength of the light of the corresponding color, and/or a thickness of a second setting film layer of each of the colored organic light-emitting units is an even multiple of the half wavelength of the light of the corresponding color, wherein the second setting film layer is close to a light-emitting side of the display panel, and the first setting film layer is disposed below the second setting film layer.

In another embodiment, the above step S102 can be replaced with:

S201, bending the flexible substrate disposed with the anode to obtain a bent substrate;

for example, after the anode 21 is formed, the flexible substrate 10 covered with the anode 21 is bent to obtain the bent substrate.

S202, vapor-depositing an organic luminescent material on the bent substrate to form the organic light-emitting layer.

For example, the organic luminescent material is evaporated on the bent substrate to form the organic light-emitting layer. In an embodiment, in order to further improve the thickness uniformity of the organic light-emitting layer, the step of vapor-depositing the organic luminescent material on the bent substrate includes:

S2021, using a setting evaporation device to vapor-deposit the organic luminescent material on the flexible substrate after bending.

Figure 6:
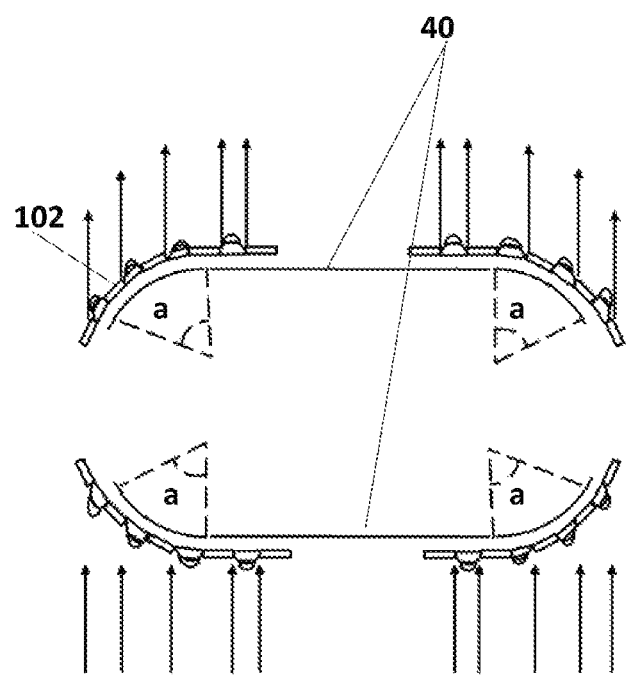
FIG. 6 is a schematic structural diagram of a setting evaporation device according to the present invention.

As shown in FIG. 6, the setting evaporation device 40 includes an evaporation chamber and a plurality of nozzles (not shown in the figure) connected to the evaporation chamber, and an arrangement direction of the plurality of nozzles is parallel to a bending direction of the bending region 102. For example, a linear evaporation device parallel to the bending region 102 is used for evaporation, so that the organic light-emitting layer forms a uniform film thickness along a required bending direction in the evaporation process. As a result, the device is formed into a uniform morphology along the sight line at the beginning of formation, and a relatively ideal thickness distribution of increasing transmittance film is obtained, which further improves the display effect.

Since a panel is pre-bent before the organic luminescent material is vapor-deposited, uneven evaporation can be avoided, and the thickness uniformity of the organic light-emitting layer is improved.

The display panel of the present invention, the manufacturing method thereof, and the electronic device using same, wherein a thickness of a first setting film layer of each of the colored organic light-emitting units of each color is an odd multiple of a half wavelength of the light of the corresponding color, and/or a thickness of a second setting film layer of each of the colored organic light-emitting units is an even multiple of the half wavelength of the light of the corresponding color, and the thickness of the first setting film layer is an odd multiple of the half wavelength of the light of the corresponding color, so that the light emitted to the anode exhibits an effect of increasing reflection; the thickness of the second setting film layer is an even multiple of the half wavelength of the light of the corresponding color, so that the light emitted to the light-emitting side exhibits an effect of increasing transmittance. As a result, the light output rate of the bending region is increased, and the brightness of the bending region and the non-bending region is more uniform, which improves the display effect.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising at least one bending region and a non-bending region in a top view, wherein a cross-sectional structure of the display panel comprises:

a display unit provided on a flexible substrate, wherein the display unit comprises a plurality of colored organic light-emitting units, each of the colored organic light-emitting units of each color is configured to emit light of a corresponding color, and a cross-sectional structure of each of the colored organic light-emitting units comprises: an anode, an organic light-emitting layer, a cathode, and an encapsulation layer;

wherein a thickness of a first setting film layer of each of the colored organic light-emitting units of each color is an odd multiple of a half wavelength of the light of the corresponding color, and a thickness of a second setting film layer of each of the colored organic light-emitting units is an even multiple of the half wavelength of the light of the corresponding color;

wherein the second setting film layer is close to a light-emitting side of the display panel, and the first setting film layer is disposed below the second setting film layer; and wherein the thickness of the second setting film layer of each of the colored organic light-emitting units of each color positioned in the non-bending region is an even multiple of the half wavelength of the light of the corresponding color, a compensation film thickness of the second setting film layer of each of the colored organic light-emitting units of each color in the bending region is an even multiple of the half wavelength of the light of the corresponding color, and the compensation film thickness of the second setting film layer is obtained by compensating the thickness of the second setting film layer through a preset included angle, wherein the preset included angle is an included angle between a tangent direction of the bending region and a setting line.

2. The display panel according to claim 1, wherein the first setting film layer comprises the anode, and the second setting film layer comprises the cathode and the encapsulation layer.

3. The display panel according to claim 2, wherein a first functional layer is provided between the anode and the organic light-emitting layer, and the first setting film layer further comprises the first functional layer.

4. The display panel according to claim 2, wherein the second setting film layer further comprises the organic light-emitting layer.

5. The display panel according to claim 4, wherein a second functional layer is provided between the organic light-emitting layer and the cathode, and the second setting film layer further comprises the second functional layer.

6. The display panel according to claim 1, wherein the compensation film thickness of the first setting film layer or the compensation film thickness of the second setting film layer, d1, is calculated by following formula:

$$d1 = d0/\cos\varphi;$$

where d0 is the thickness of the first setting film layer or the thickness of the second setting film layer, and $\varphi$ is the preset included angle.

7. A method of manufacturing the display panel of claim 1, wherein the display panel comprises a bending region and a non-bending region, and the method comprises:
fabricating an anode on a flexible substrate;
fabricating an organic light-emitting layer on the anode;
fabricating a cathode and an encapsulation layer on the organic light-emitting layer in sequence;
wherein a thickness of a first setting film layer of each of the colored organic light-emitting units of each color is an odd multiple of a half wavelength of the light of the corresponding color, and a thickness of a second setting film layer of each of the colored organic light-emitting units is an even multiple of the half wavelength of the light of the corresponding color; and
wherein the second setting film layer is close to a light-emitting side of the display panel, and the first setting film layer is disposed below the second setting film layer.

8. The method of manufacturing the display panel according to claim 7, wherein the step of fabricating the organic light-emitting layer on the anode comprises:
bending the flexible substrate disposed with the anode to obtain a bent substrate;
vapor-depositing an organic luminescent material on the bent substrate to form the organic light-emitting layer.

9. The method of manufacturing the display panel according to claim 8, wherein the step of vapor-depositing the organic luminescent material on the bent substrate comprises:
using a setting evaporation device to vapor-deposit the organic luminescent material on the flexible substrate after bending;
wherein the setting evaporation device comprises an evaporation chamber and a plurality of nozzles connected to the evaporation chamber, and an arrangement direction of the plurality of nozzles is parallel to a bending direction of the bending region.

10. An electronic device comprising a display panel, the display panel comprising at least one bending region and a non-bending region in a top view, wherein a cross-sectional structure of the display panel comprises:
a display unit provided on a flexible substrate, wherein the display unit comprises a plurality of colored organic light-emitting units, each of the colored organic light-emitting units of each color is configured to emit light of a corresponding color, and a cross-sectional structure of each of the colored organic light-emitting units comprises: an anode, an organic light-emitting layer, a cathode, and an encapsulation layer;
wherein a thickness of a first setting film layer of each of the colored organic light-emitting units of each color is an odd multiple of a half wavelength of the light of the corresponding color, and a thickness of a second setting film layer of each of the colored organic light-emitting units is an even multiple of the half wavelength of the light of the corresponding color;
wherein the second setting film layer is close to a light-emitting side of the display panel, and the first setting film layer is disposed below the second setting film layer; and
wherein the thickness of the second setting film layer of each of the colored organic light-emitting units of each color positioned in the non-bending region is an even multiple of the half wavelength of the light of the corresponding color, a compensation film thickness of the second setting film layer of each of the colored organic light-emitting units of each color in the bending region is an even multiple of the half wavelength of the light of the corresponding color, and the compensation film thickness of the second setting film layer is obtained by compensating the thickness of the second setting film layer through a preset included angle, wherein the preset included angle is an included angle between a tangent direction of the bending region and a setting line.

11. The electronic device according to claim 10, wherein the first setting film layer comprises the anode, and the second setting film layer comprises the cathode and the encapsulation layer.

12. The electronic device according to claim 11, wherein a first functional layer is provided between the anode and the organic light-emitting layer, and the first setting film layer further comprises the first functional layer.

13. The electronic device according to claim 11, wherein the second setting film layer further comprises the organic light-emitting layer.

14. The electronic device according to claim 13, wherein a second functional layer is provided between the organic light-emitting layer and the cathode, and the second setting film layer further comprises the second functional layer.

15. The electronic device according to claim 10, wherein the compensation film thickness of the first setting film layer, d1, or the compensation film thickness of the second setting film layer, d1, is calculated by following formula:

$$d1 = d0/\cos\varphi;$$

where d0 is the thickness of the first setting film layer or the thickness of the second setting film layer, and $\varphi$ is the preset included angle.

* * * * *